May 24, 1960 B. M. GORDON 2,938,172
VOLTAGE CONTROLLED OSCILLATOR
Filed Aug. 13, 1957
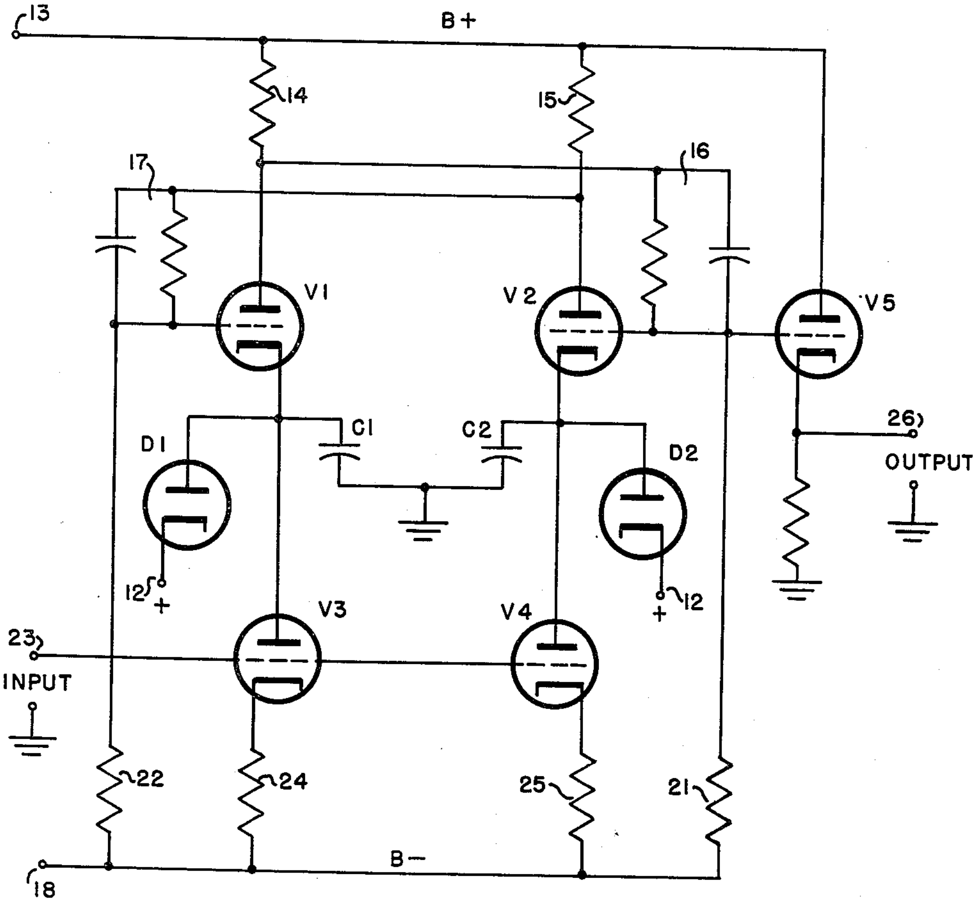
INVENTOR.
BERNARD M. GORDON
BY Joseph Weingarten
ATTORNEY 2,938,172

VOLTAGE CONTROLLED OSCILLATOR

Bernard M. Gordon, Newton, Mass., assignor to Epsco, Incorporated, Boston, Mass., a corporation of Massachusetts Filed Aug. 13, 1957, Ser. No. 677,891

1 Claim. (Cl. 331—144)

The present invention relates in general to electrical signal generation and more particularly concerns a novel circuit which provides an output signal of substantially rectangular waveform whose frequency is linearly related to the instantaneous amplitude of an input signal. This linear relation is retained despite extensive variations in input signal amplitude, thereby permitting corresponding wide deviations in the frequency of the output signal. Though generally applicable in the frequency modulation art, the novel circuit herein disclosed is especially useful as an analog data-to-pulse rate conversion device.

Innumerable frequency and phase modulators have been described in the patents and the literature. One of the most frequently used circuits for providing a frequency-modulated output signal employs an oscillator having a frequency determining impedance element, such as an LC tank circuit, shunted by a voltage sensitive reactance tube. By applying the input signal to the reactance tube grid, the instantaneous oscillator frequency may be caused to follow accordingly. Although conventional circuits of this type will perform satisfactorily in communications equipment and the like, difficulties inherent in electronic impedance devices are encountered which preclude their use in systems with rigid specifications as to linearity in the relationship between output freqeuncy and input signal amplitude, as to center frequency stability, and as to the dynamic range of frequency deviation within preestablished linearity tolerances.

The present invention represents an extension of the principles disclosed in the application entitled Voltage Controlled Oscillator, Serial No. 656,706, filed May 2, 1957, which illustrated a circuit capable of providing an output signal whose instantaneous frequency was linearly related to the instantaneous amplitude of an input signal, despite exceedingly broad variations in input signal amplitude and despite wide frequency excursions about a stable center frequency.

Generally speaking, the previous application disclosed a free-running multivibrator circuit constituted of two electron tubes whose cathodes were directly interconnected by a single timing capacitor. Each of these cathodes was individually clamped to a predetermined potential by respective clamping diodes, as a result of which the timing capacitor assumed an initial charge condition in the interval during which the multivibrator circuit switched from one state to another. During the time that the multivibrator circuit remained in one of its two stable states, energy was exchanged through a substantially constant current tube connected in the cathode circuit of the multivibrator tube then non-conducting, whereby the rate of change of charge upon the timing capacitor was maintained substantially constant.

In the previous device, the input signal was supplied to the control grid of the constant current tube thereby controlling the value of the rate of change of charge upon the timing capacitor. The voltage at the cathode of the non-conducting multivibrator tube changed linearly until it reached a value where the grid-cathode potential rose above cutoff, at which time that tube began to conduct. Cross-coupling means between the plate of each multivibrator tube and the grid of the other transferred potentials which rapidly reversed the state of the tubes. Thus, the switching time of the multivibrator was proportional to the rate of change of charge upon the timing capacitor which in turn was controlled by the constant current tube. Since a high resistance was used in the cathode circuit of the constant current tube, the value of the constant current was linearly related to the instantaneous amplitude of the input signal.

Although the circuit described in the cited patent application was capable of performing as a linear, voltage sensitive oscillator over relatively broad ranges of input signal and frequency excursion, certain limitations of that design have become apparent. Thus, an element in the timing cycle was the interval required to recharge the timing capacitor. Due to the fact that this capacitor was charged from a low impedance circuit, the recharging time was exceedingly small, though relatively constant. Thus, when the circuit was operating at comparatively low frequencies, the recharging time constituted a negligible fraction of the period of oscillation. However, in attempting to utilize that circuit at exceedingly high frequencies, it was found that the recharging time could no longer be ignored, and that due to its constancy, the relative error and hence nonlinearity would increase with increasing frequency.

The present invention contemplates and has as a primary object the provision of an oscillator having the general characteristics of that described in the cited application while exhibiting extreme linearity even at exceedingly high frequencies.

Generally, in accordance with the principles of this invention, a pair of timing capacitors is substituted for the single capacitor disclosed in the preceding circuit. As a result, the capacitors are effective alternately in controlling the switching rate of the associated multivibrator, and the external circuits are so arranged that while one capacitor controls the frequency of operation, the other is recharged and placed in a condition to assume control of the frequency on the succeeding half cycle without the loss of a time interval, however brief, for restoring the required charge. Resultantly, this circuit provides a voltage sensitive oscillator with but a relatively small number of inexpensive, standard components arranged whereby the number of critical parameter values is minimized, and which may operate in linear fashion over an expanded frequency spectrum.

Other features, objects and advantages of the invention will become apparent from the following specification when read in connection with the accompanying drawing, the sole figure of which is a schematic circuit diagram of a preferred embodiment of the voltage sensitive oscillator.

With reference now to the drawing, the schematic circuit diagram of the voltage controlled oscillator is seen to include a pair of electron tubes V–1 and V–2 connected as a multivibrator, the cathodes of which are respectively coupled to ground through first and second timing capacitors $C_1$ and $C_2$. The cathodes of electron tubes V–1 and V–2, and hence the upper terminals of $C_1$ and $C_2$ are each clamped to a positive potential applied to terminals 12—12 by diodes D–1 and D–2, respectively. A source of positive potential appearing at terminal 13, and exceeding the clamp voltage at terminals 12—12, is coupled to the plates of V–1 and V–2 through load resistors 14 and 15 respectively. The plates of V–1 and V–2 are cross-coupled to the grids of V–2 and V–1 respectively through resistance-capacitance transfer networks 16 and 17. These grids are also returned through grid resistors 21 and 22 respectively to a source of negative potential, less than the clamp potential at terminals 12—12, applied at terminal 18.

A pair of constant current triodes V–3 and V–4 are arranged with their plates connected to the cathodes of V–1 and V–2 respectively, and with their grids energized in parallel from input signal terminal 23. Resistances 24 and 25 of relatively high value, are connected between the source of negative potential at terminal 18 and the cathodes of V–3 and V–4 respectively. The rectangular waveform output signal, whose frequency is controlled by the input signal applied at terminal 23, is derived from the grid of V–2 and coupled to the output terminal 26 through cathode follower V–5.

Having described the physical configuration of the circuit, its mode of operation will be considered. The multivibrator circuit may assume either of two states, one with V–1 conducting and V–2 non-conducting; the other, with V–2 conducting and V–1 non-conducting. It is convenient to assume that initially the circuit resides in the first of these states and that the input potential applied at terminal 23 remains constant.

Under these circumstances, the current flow through tube V–1 is made up of the constant current flow through tube V–3 together with the current through clamp diode D–1. The cathode potential of tube V–1 is prevented from rising above the potential of terminal 12 by diode D–1. Consequently, capacitor $C_1$ is charged to the clamp potential positively with respect to ground. It will be observed that at the instant that V–1 becomes conducting a portion of the tube current is made up of the charging current capacitor $C_1$. However, this capacitor almost instantaneously reaches the clamping potential applied to terminal 12 since tube V–1 when conducting is an exceedingly low impedance. It will also be noted that the charging of capacitor $C_1$ is entirely without effect upon the circuit which includes electron tube V–2.

At the very instant that tube V–1 becomes conductive tube V–2 is cut off in conventional multivibrator fashion. During the prior interval when tube V–2 was conducting, capacitor $C_2$ was charged to the clamping potential at terminal 12. Consequently, at the instant that tube V–2 is cut off, capacitor $C_2$ becomes the sole source of plate potential and current for electron tube V–4. The high value of resistor 25 introduces a considerable amount of degeneration which results in the current through tube V–4 being maintained at a substantially constant value for a fixed value of applied grid voltage from terminal 23, despite the decreasing plate voltage which results as capacitor $C_2$ discharges through tube V–4. Since the discharge current remains constant, the rate of change of charge upon capacitor $C_2$ is constant, resulting in a linear decrease in voltage on the cathode of tube V–2, which continues until the grid-to-cathode potential of tube V–2 reaches a value at which conduction in V–2 is initiated.

The effect of the initiation of conduction in tube V–2 is to lower its plate voltage, which drop is transmitted through resistor-capacitor network 17 to the grid of V–1; thus cutting off tube V–1. Since, as previously disclosed, capacitor $C_1$ was charged to the clamping potential at terminal 12, this capacitor will now become the source of plate current for tube V–3. In the manner discussed immediately above with respect to capacitor $C_2$, capacitor $C_1$ will now discharge at a constant rate due to the constant current effect of tube V–3. The discharge will be terminated at that point in the cycle where the grid-to-cathode voltage of tube V–1 becomes of such value as to initiate conduction therein, at which point tubes V–1 and V–2 again become conductive and non-conductive respectively.

It is at once apparent that capacitor $C_2$ is charged to the clamp potential during an interval when capacitor $C_1$ and electron tube V–3 are in control of the timing cycle, and that conversely capacitor $C_1$ is likewise charged when capacitor $C_2$ and tube V–4 control the timing. Resultantly, the charging interval for each capacitor, however slight, has absolutely no effect upon the frequency of oscillation of the multivibrator constituted of electron tubes V–1 and V–2.

Since resistors 24 and 25 each introduce a large amount of degenerative feedback into the respective circuits, the relationship between the plate currents in tubes V–3 and V–4 in response to the applied grid voltage at terminal 23 is extremely linear over a wide dynamic range; hence, the slope of the waveform of voltage at each of the cathodes of V–1 and V–2 are linearly related to the input grid voltage applied at terminal 23.

In summary, then, operation of the circuit during each full cycle results in control being alternately transferred from the circuit made up of $C_1$ and V–3, to $C_2$ and V–4. If these capacitors are precisely equal in value, then symmetrical, though out of phase, rectangular waveforms will be achieved at the plates of electron tubes V–1 and V–2. If the capacitors $C_1$ and $C_2$ are of unequal value, then an unsymmetrical voltage output waveform will be the result, the tube with the smaller capacitor providing the shorter output half-cycle.

In the schematic diagram, the output signal is derived by coupling the grid voltage waveform which appears upon the grid of tube V–2 to the output terminal 26 by means of a cathode follower V–5, thereby furnishing the desired frequency modulated output wave at low impedance. The frequency of the output signal is primarily dependent upon the value of capacitors $C_1$ and $C_2$, noted above, and upon the magnitude of the currents passed by the constant current tubes V–3 and V–4. The inverse feedback introduced by resistors 24 and 25 results in stable operation of the circuit despite wide variations in tube characteristics due to aging or changing of tubes. Diodes D–1 and D–2 and the clamping potential at terminals 12—12 precisely control the initial conditions upon capacitors $C_1$ and $C_2$.

As an alternative to utilizing an unequal capacitor arrangement to achieve an unsymmetrical output square wave resistors 24 and 25 may, if desired, be of different value. Effectively, these resistors set the constant current and hence the discharge rate of their respective capacitors. Resistors 24 and 25 may be made variable to achieve this result and if preferred the lower end of both of these resistors may be tied together and returned to B— through a common variable resistor which may be used as a vernier to adjust the frequency about which the input signal will cause frequency modulation.

A circuit constructed in accordance with these teachings has successfully responded to input signals to provide broad frequency deviations with negligible deviation from precise linearity. Of special importance, the output signal is not amplitude modulated by the input and further no component of the input is super-imposed upon the output.

Those skilled in the art may now make numerous modifications of and departures from the specific circuit described herein without departing from the inventive concepts. Consequently, the invention is to be construed as limited only by the spirit and scope of the appended claim.

What is claimed is:

Apparatus for providing an output signal of frequency controlled by an input signal comprising, first and second electron tubes each having at least a cathode, grid and plate, a first potential source, a load impedance connecting each of said electron tube plates to said first potential source, means for regeneratively cross-coupling the plates of each of said electron tubes to the grid of the other, first and second timing capacitors respectively coupled from the cathodes of said first and second electron tubes to a reference potential point, a second potential source, a third potential source intermediate said first and second sources, first and second diodes connected respectively between the cathodes of said first and second electron tubes and said third potential source, said first and second diodes being poled to respectively clamp said cathodes of said first and second electron tubes to said third potential source, said third potential source being positive with respect to the potential at said reference point, third and fourth electron tubes for current control each having at least a cathode, grid and plate, means for applying said input signal to said grids of said third and fourth electron tubes in parallel, said plates of said third and fourth electron tubes being connected to said cathodes of said first and second electron tubes respectively, a pair of relatively high resistances respectively coupling said cathodes of said third and fourth electron tubes to said second potential source, said first capacitor being arranged to discharge through said third electron tube at a rate proportional to said input signal during intervals of non-conduction of said first electron tube and to recharge substantially to the potential of said third source during intervals of conduction of said first electron tube, said second capacitor being arranged to discharge through said fourth electron tube during intervals of non-conduction of said second electron tube and to recharge substantially to the potential of said third source during intervals of conduction of said second electron tube, and means for deriving said output signal from a plate of one of said first and second electron tubes.

References Cited in the file of this patent

UNITED STATES PATENTS

| | | |
|---|---|---|
| 2,456,089 | Shenk et al. | Dec. 14, 1948 |
| 2,494,357 | Rogers | Jan. 10, 1950 |
| 2,846,583 | Goldfischer et al. | Aug. 5, 1958 |